(12) United States Patent
Porter

(10) Patent No.: US 12,021,529 B2
(45) Date of Patent: Jun. 25, 2024

(54) ACTIVE DIFFERENTIAL TERMINATION CIRCUIT TO COMPENSATE FOR IMPEDANCE MISMATCH

(71) Applicant: SEMTECH CORPORATION, Camarillo, CA (US)

(72) Inventor: Steven Greig Porter, Ottawa (CA)

(73) Assignee: SEMTECH CORPORATION, Camarillo, CA (US)

( * ) Notice: Subject to any disclaimer, the term of this patent is extended or adjusted under 35 U.S.C. 154(b) by 0 days.

(21) Appl. No.: 17/947,010

(22) Filed: Sep. 16, 2022

(65) Prior Publication Data
US 2024/0097659 A1    Mar. 21, 2024

(51) Int. Cl.
*H03K 3/012* (2006.01)
*H03F 3/45* (2006.01)

(52) U.S. Cl.
CPC ......... *H03K 3/012* (2013.01); *H03F 3/45475* (2013.01)

(58) Field of Classification Search
CPC . H03K 3/012; H03F 3/45475; H03F 3/45076; H03F 1/56; H04L 25/0278; H04L 25/0298; H04L 25/0274; H04B 1/123
See application file for complete search history.

(56) References Cited

U.S. PATENT DOCUMENTS 8,933,729 B1 *   1/2015   Shi ...................... H03F 3/45179
                                                      326/82

* cited by examiner

*Primary Examiner* — Jung Kim
(74) *Attorney, Agent, or Firm* — Morgan, Lewis & Bockius LLP

(57) ABSTRACT

A differential signal driver may include a driver circuit and a feedback loop. The driver circuit may include a first output node coupled to a first termination node for receiving a first termination bias voltage, a second output node coupled to a second termination node for receiving a second termination bias voltage, and a bias network connected to the second output node and to the second termination node. The feedback loop may include a first feedback resistor connected to the first output node at a first end of the first feedback resistor, a second feedback resistor connected to the second output node at a first end of the second feedback resistor, and a feedback amplifier configured to provide a feedback correction current from a common mode voltage to a node within the line from the first output node to the first termination node.

20 Claims, 7 Drawing Sheets

ACTIVE DIFFERENTIAL TERMINATION CIRCUIT TO COMPENSATE FOR IMPEDANCE MISMATCH

BACKGROUND

High speed differential signal drivers often provide a direct current (DC) bias to a load, such as lasers, in addition to the high speed signal. The differential signal drivers employ a bias network including inductors and/or ferrites at only one side of the differential output, typically the anode side rather than the cathode side, to provide the DC bias to the load. To achieve good performance across a wide range of frequencies, these bias networks often include multiple components including one or more large inductors to provide a good impedance down to low frequencies. However, it may be difficult to accurately sense a bias current through the bias network without increasing the power consumption due to the low and variable impedance of ferrites and inductors at low frequencies. In addition, modifying the driver output voltage or current on the output side with the bias network would increase the power consumption significantly because the output voltage swings above the power supply powering the bias network. For data communications where a significantly wide bandwidth is required, improved signal drivers are needed.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure.

Figure 1A:
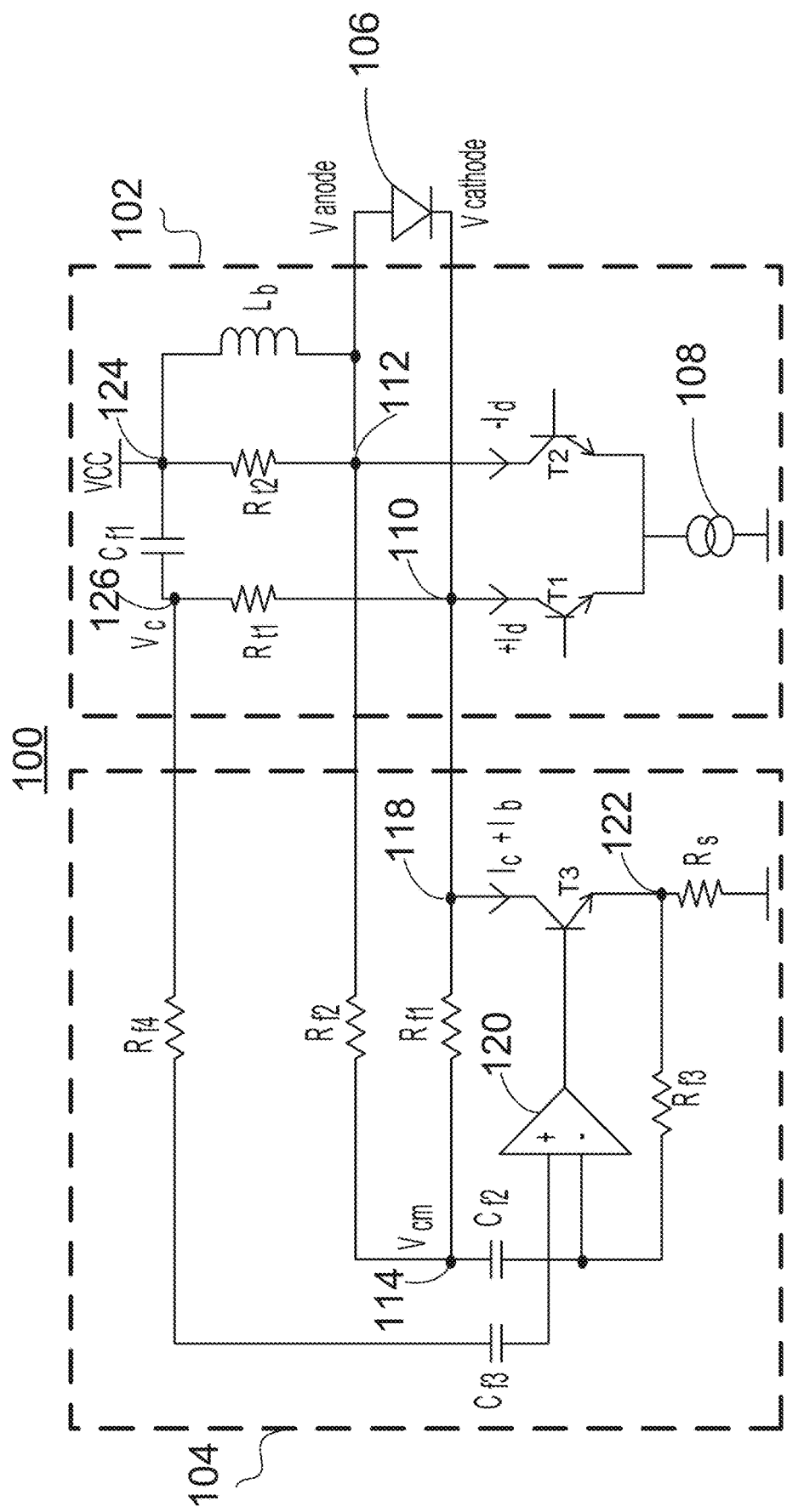
FIG. 1A illustrates a circuit diagram of an example differential signal driver with a feedback loop to maintain an accurate impedance matching using negative-positive-negative (NPN) bipolar transistors.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The present description relates to semiconductor integrated circuits, including, without limitation, to an active differential termination circuit to compensate for a poor impedance matching on one side of a differential termination for high bandwidth applications.

High speed differential drivers may require bias networks including large inductors or ferrites to provide a DC bias. The DC bias may require large inductors to reduce the degradation in low frequency performance caused by the DC bias. Some approaches may use multiple inductors in addition to a ferrite to provide the DC bias. To reduce the size and number of the components in these bias networks, active impedance generation may be implemented by sensing the voltage and current and the output node of the driver and adjusting the output to generate a desired impedance. The active termination may allow a significant reduction in the number and/or size of bias inductors in the bias network. Active impedance generation may be used to sense the output voltages of the driver and apply a feedback to maintain a differential output impedance despite the impedance of the bias network dropping at low frequencies.

At low frequencies, a ferrite reduces the effective impedance on the anode side which may result in DC wander/fluctuation. To mitigate this low frequency wander, a feedback loop may be employed in the present implementation to actively increase the cathode impedance in the required frequency band and thus maintain a constant differential impedance. The active termination implementation in the present disclosure may address the low frequency performance degradation issues seen in conventional approaches and allows a significant reduction in the number and/or size of bias inductors.

The active termination implementation in the present disclosure provides significant differences and advantages over other approaches. The active termination may sense and modulate an output side of the driver, for example, the cathode side, with accurate impedance matching over frequencies to compensate for the output side having poor matching, for example, an anode side, to achieve a minimal power solution with good differential impedance.

In particular, in one or more aspects, the high speed differential signal is not sensed in the present implementation. Instead, the common mode output voltage and the cathode termination resistor bias may be sensed. In this regard, the output current is not sensed directly.

A feedback loop within the present implementation may modulate the single-ended cathode current to maintain the differential output impedance. This may provide a minimal power increase to extend the differential output impedance in the lower frequency range.

Using the present implementation, the size and number of inductors in the bias network are reduced, and/or the low frequency performance is improved.

Figure 1B:
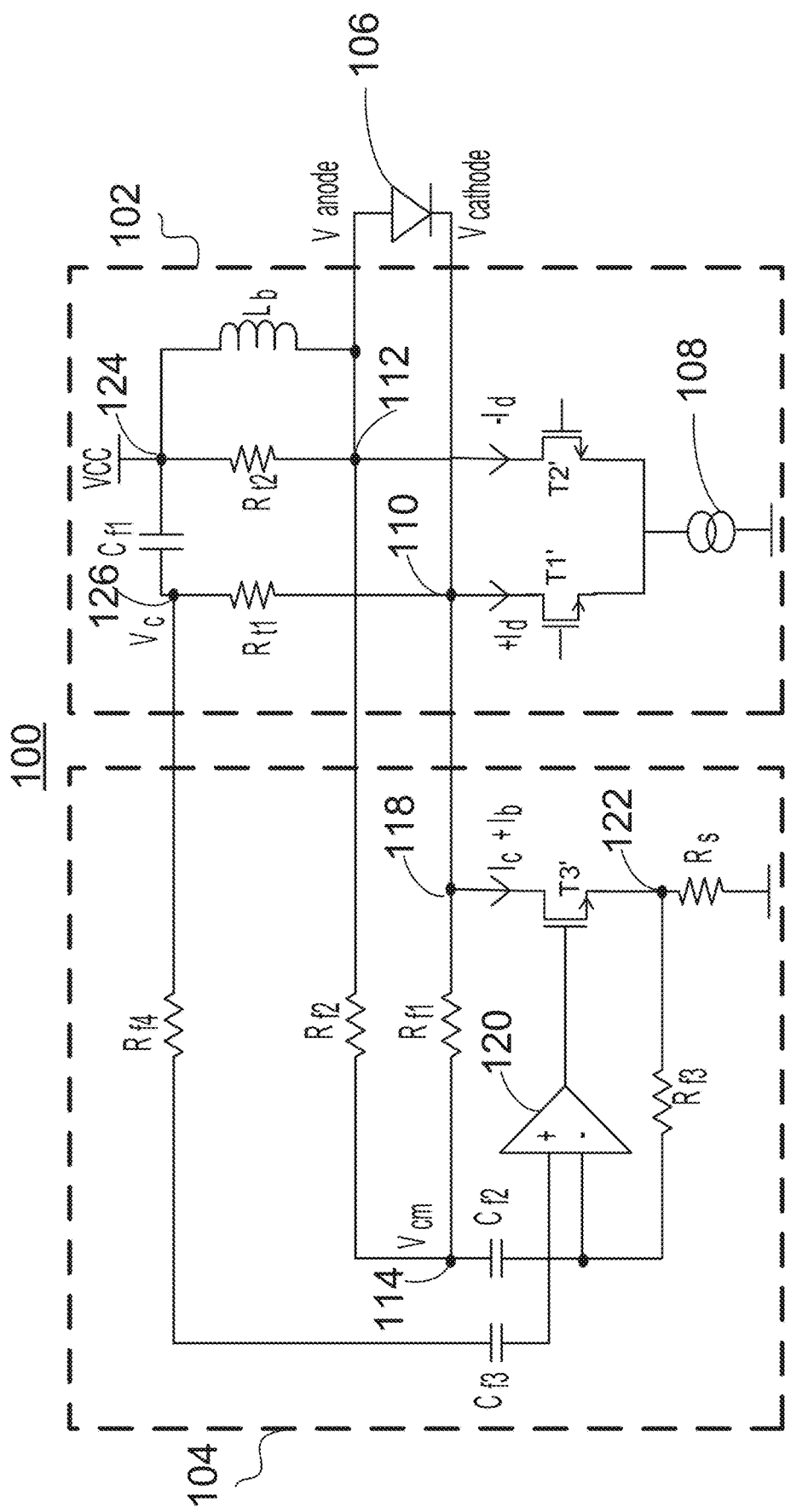
FIG. 1B illustrates a circuit diagram of an example differential signal driver with a feedback loop to maintain an accurate impedance matching using N-type metal-oxide-semiconductor (NMOS) transistors.

FIG. 1A illustrates a circuit diagram of an example differential signal driver with a feedback loop to maintain an accurate impedance matching using negative-positive-negative (NPN) bipolar transistors. FIG. 1B illustrates a circuit diagram of an example differential signal driver with a feedback loop to maintain an accurate impedance matching using N-type metal-oxide-semiconductor (NMOS) transistors.

Referring to FIG. 1A, an example circuit diagram 100 may include an example driver circuit 102 and an example feedback loop 104. The driver circuit 102 may provide a driving signal to a load 106, such as a diode or a laser. In some examples, the load 106 may be a directly modulated laser (DML).

The driver circuit 102 may implement a modulation differential current pair as +Id and −Id as shown in FIG. 1A. The modulation differential current pair +Id and −Id may be supplied from a current source 108 and may flow into a cathode termination resistor Rt1 and an anode termination resistor Rt2, respectively, and generate the output signals from the driver circuit 102 to the load 106 through the output nodes 110 and 112. The modulation differential current pair may provide alternating current (AC) signals. The termination resistors Rt1 and Rt2 may be fixed or variable. In some examples, the termination resistors Rt1 and Rt2 may be the same. In some examples, the termination resistors Rt1 and Rt2 may be relatively small compared with other resistors in the circuit diagram 100. For example, the resistance of the termination resistors Rt1 and Rt2 may be less than 100 Ohms such as 25 Ohms. The current source 108 may be part of a communication network that transmits and/or receive signals. The cathode termination resistor Rt1 may be connected to a cathode termination bias voltage Vc at cathode bias termination node 126 and also connected to the cathode side of the load 106 through the output node 110. In some examples, Vc may be sensed and adjusted by a feedback loop 104 or supplied by a DC power supply. The anode termination resistor Rt2 may be connected to an anode termination DC bias voltage Vcc through the anode bias termination node 124 and connected to the anode side of the load 106 through the output node 112. The anode termination DC bias voltage Vcc may be supplied by a DC power supply. A capacitor Cf1 may be connected between the nodes of the termination bias voltages Vc and Vcc and configured to filter certain high frequency signals. The modulation differential current pair +Id and −Id may flow through transistors T1 and T2, respectively. Each of the transistors T1 and T2 may include one or more transistors. In one or more aspects, a current source (e.g., 108) may be sometimes referred to as a current sink and vice versa.

The modulation differential current pair +Id and −Id may be supplied to the cathode side of the load 106 through the output node 110, and to the anode side of the load 106 through the output node 112, respectively. The driver circuit 102 may include a bias network Lb (for example, one or more inductors or ferrites) connected in parallel with one of the termination resistors (for example, Rt2) to provide a DC bias Vanode and current to the anode side of the load 106.

Through the feedback loop 104, the circuit diagram 100 may control the impedance on a different side of the bias network Lb, for example, the cathode side of the load 106 to achieve good and flat/consistent level output signals over a wide frequency range. The frequency range of a flat response may be from a Kilohertz (KHz) range to a Gigahertz (GHz) range. A common mode output voltage Vcm may be sensed at the output node (or a common node) 114 from the driver circuit 102, which may be the average voltage of the voltages of the two output nodes 110 and 112 through the feedback resistors Rf1 and Rf2 respectively. These two feedback resistors Rf1 and Rf2 are connected to the differential voltages at the two output nodes 110 and 112, the common mode output voltage Vcm may be close to 0 when Rf1=Rf2. The common mode output voltage Vcm may be a low frequency or low speed signal. The common mode voltage Vcm may not contain the high speed data. Processing a low frequency data may be easier because the data contains high resistive components with negligible parasitic influence. The differential driver in the present disclosure effectively converts high frequency data to low frequency data to reduce the influence of parasitic capacitance and inductance at a high frequency.

The output node 114 may be connected to a feedback capacitor Cf2 which may be further connected to a negative input node of a feedback amplifier 120. The feedback capacitor Cf2 may be also connected to a feedback resistor Rf3. The feedback resistor Rf3 may be connected to a sense resistor Rs which may be connected to a ground. The feedback amplifier 120 and the feedback resistor Rf3 may provide a current gain at the output. A transistor T3 may be connected to an output of the feedback amplifier 120 through the base terminal, to a current injection node 118 (the same as the output node 110) through the connector terminal, and to the joint node 122 of the feedback resistor Rf3 and the sense resistor Rs. In some examples, the resistance of the sense resistor Rs=2Rt1=2Rt2. The cathode bias termination node 126 connected to the cathode termination bias voltage Vc may be connected to a feedback resistor Rf4 and a feedback capacitor Cf3 in series which may connect to a positive input node of the feedback amplifier 120. The positive input node of the feedback amplifier 120 may be connected to one or more resistors (not shown) to provide a DC bias to the feedback amplifier 120. In one or more aspects, the DC bias current Ib is not controlled or determined by the bias network Lb, but is controlled and determined by the DC bias to the feedback amplifier 120. The feedback capacitors Cf2 and Cf3 may further be configured to filter certain high frequency or high speed signals, and/or block the DC currents. Compared with other approaches in which high frequency or high speed signals at high speed nodes, such as output nodes 110 and 112, are sensed, the present disclose may sense low frequency or low speed signals which may yield more accurate feedback results.

In some examples, as shown in FIG. 1A, the transistor T1, T2, and T3 may be bipolar NPN transistors. In some examples, as shown in FIG. 1B, the transistors T1', T2' and T3' may be NMOS transistors.

The common mode output voltage Vcm may be relatively fixed with respect to the differential voltages between the two output nodes 110 and 112, and the current shown as Ic+Ib on the collector side of the transistor T3 may also be maintained at a constant level over a broad range of frequency range. Ic may be referred to as the feedback correction current. The feedback correction current Ic generated by the feedback loop 104 may be supplied to the current injection node 118 (the same as the output node 110). The feedback correction current Ic may directly control the current through the load 106. As long as the current is controlled on the cathode side and the correct current is going through the load 106, a flat frequency response from the load 106 may be obtained. Ic may be a low frequency current, for example, between 100 KHz to 5 MHz. The feedback correction current Ic may be used to modulate the current at the cathode side of the load 106. The feedback correction current Ic may be a current supplied to the cathode bias termination node 126 in addition to the modulation current +Id. Ib is the DC bias current which may be generated by the anode termination DC bias voltage Vcc and supplied to the load 106. Ib may flow through the bias network Lb, the load 106, T3, and Rs. At the joint node 122, the feedback loop 104 may sense the Ic+Ib current by sensing the voltage at joint node 122 as Rs×(Ic+Ib).

The feedback correction to the current and to the output impedance may be especially useful in the low frequency range of the signal band. When the feedback loop 204 is not implemented, the signal may have a performance degradation in the low frequency range.

An equation for the feedback loop 104 to achieve active feedback termination may be shown as:

$$Vc - Rt \times Ic = Vanode + Vcathode$$

wherein Vc is the cathode bias voltage, Rt is the termination resistor and the resistance of Rt=Rt1=Rt2, Ic is the feedback back correction current generated by the feedback loop 104, Vanode is the voltage at the output node 112 of the driver circuit 102 connected to the anode side of the load 106, and Vcathode is the voltage at the output node 110 of the driver circuit 102 connected to the cathode side of the load 106. Rt×Ic is the voltage drop across the resistor Rt1.

The feedback resistor Rf3 may be used to compensate for the Rt×Ic voltage drop across the resistors Rt1, wherein Rt1=Rt. Ic may be a current component flowing through Rt1, in addition to the modulation current +Id.

In some examples, the low frequency cutoff by the feedback loop 104 may be determined by the time constant: Cf×Rf/2, wherein Cf is a feedback capacitor and the capacitance of Cf=Cf2=Cf3, and Rf is feedback resistor and the resistance of Rf=Rf1=Rf2=2Rf4=Rf3.

In some examples, the feedback resistors Rf1 and Rf2 may have large resistor values, such as around 100 KOhms. In some examples, the feedback capacitors Cf2 and Cf3 may be configured to bypass signals at certain desired frequency range. In some examples, Cf2 and Cf3 may have a capacitance value limited by the dimension, space and/or structure of the circuit board. In some examples, Cf2 and Cf3 may have a capacitance value at around 20 pico farads (pF). The feedback resistors Rf1 and Rf2 may need to be large to obtain a large time constant with the feedback capacitors Cf2 and/or Cf3. As further shown in FIG. 4, the feedback impedance response may keep the correct differential impedance until a certain frequency at which the feedback capacitors Cf2 and Cf3 start to block the feedback at low frequencies. Therefore, a lower time constant may be obtained when the product of the feedback resistor and the feedback capacitor is higher. When the time constant is lower, the frequency at which the signal gets blocked is lower when the feedback is no longer effective.

The feedback loop may not be configured to function at DC because at DC a low impedance at the anode of the load 106 may be needed for a low power consumption. In some examples, the correct impedance may only be maintained down to 100 KHz where the data is available. Below the 100 KHz range, an extra current to the anode of the load 106 may not be desirable because low impedance is needed and the extra power would be wasted.

In some examples, the RC time constant may be configured to be below the lowest frequency of the signal data content.

Compared with other systems that result in poor impedance matching over a wide frequency range, the present disclosure may achieve a good accurate output impedance matching over a wide frequency range. For example, a flat frequency response from the driver circuit 102 to the feedback correction current provided to the load 106 is achieved. A good accurate output impedance matching may also reduce unwanted reflections when the signal transmits in the transmission line to the load 106.

In some examples, the feedback resistors Rf1, Rf2, Rf3, and Rf4 and the termination resistors Rt1 and Rt2 may have fixed resistance and may be configured to have a stable impedance with negligible parasitic capacitance and inductance over a wide range of frequencies. In some examples, to further reduce the parasitic capacitance and inductance, additional capacitance and inductance may be added to the feedback and/or termination resistors to adjust the impedance over frequency. In some examples, to further reduce the parasitic capacitance and inductance, the feedback and/or termination resistors may be programmable.

In some examples, the common mode voltage Vcm and the cathode termination bias voltage Vc at the cathode bias termination node 126 may be sensed by the feedback loop 104. The feedback correction current Ic may be sensed by the feedback loop 104 at the joint node 122 as a voltage indirectly. The common mode voltage Vcm and the cathode termination bias voltage Vc may be compared and kept fixed relative to each other, so that the output current at the output node 110 stays constant to achieve a fixed flat frequency response to the load 106.

Figure 2A:
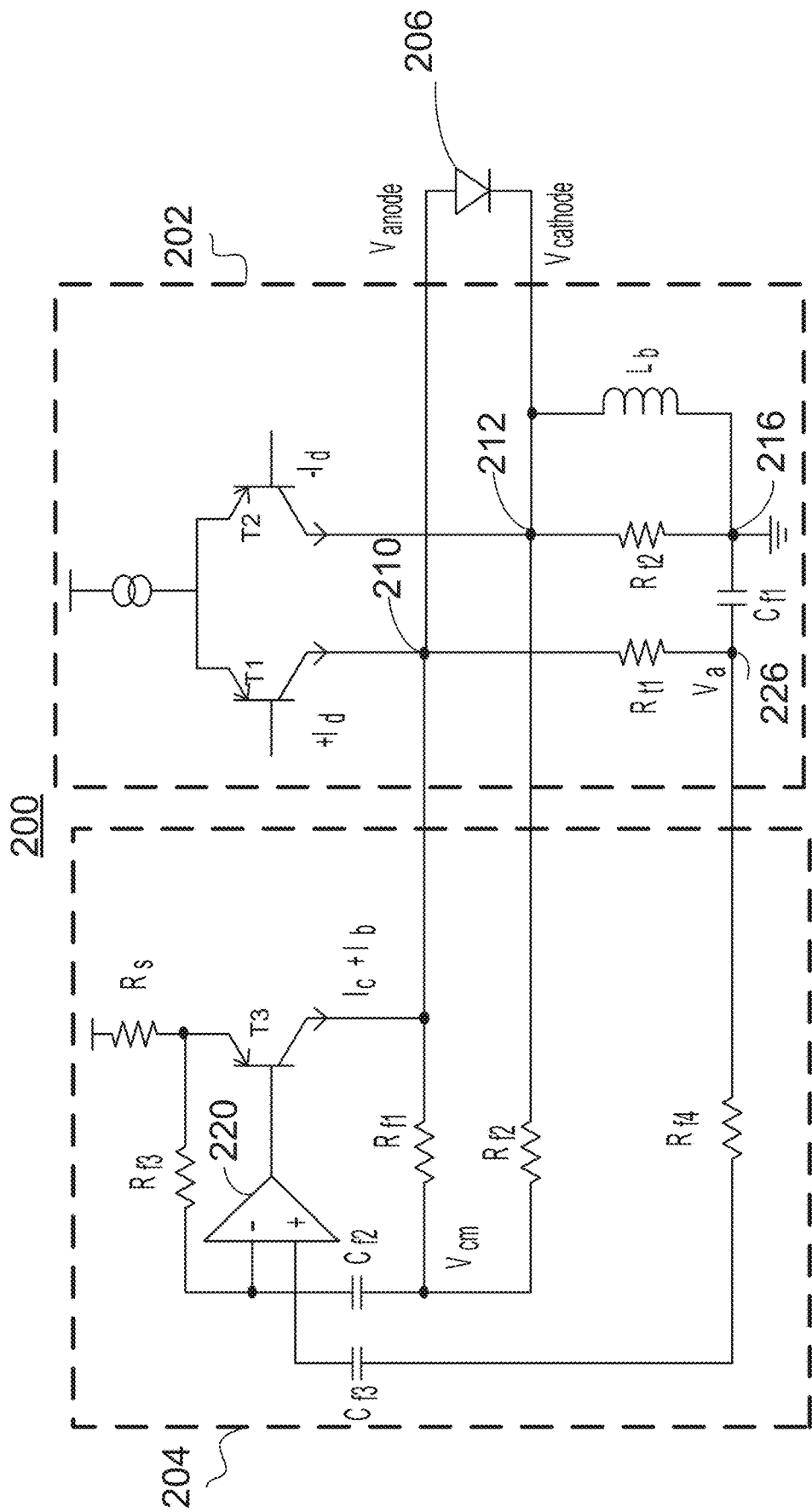
FIG. 2A illustrates a circuit diagram of an example differential signal driver with a feedback loop to maintain an accurate impedance matching using positive-negative-positive (PNP) bipolar transistors.

The differential signal driver with a feedback loop (e.g., 100 or 200) in the present disclosure may sense the signal at one side (e.g., at the cathode side as shown in FIG. 1A, or at the anode side as shown in FIG. 2A) of the differential output and apply a feedback signal to the one side of the differential output to compensate for poor impedance on the other side (e.g., at the anode side as shown in FIG. 1A, or at the cathode side as shown in FIG. 2A) of the differential output.

In order to implement an active feedback impedance generation, in some approaches, current sensing may be needed at the output (e.g., the side with the bias network Lb) of the driver circuit. Sensing the current through the bias network Lb may be difficult. For minimal power consumption, the lowest ohmic potential drop or DC resistance is needed through the inductor within the bias network Lb. While one way of sensing the current is to add a resistor in series with the inductor, and to sense the voltage drop across the resistor to sense the current. The problem associated with sensing the current on the same side of the bias network Lb is that a large current may need to be injected at the output node 112. A larger power supply may be needed which may increase the power consumption.

In contrast, in the present implementation, by modifying the current in the feedback loop 104, which may also be the current flowing through the load 106, no additional power may be needed to implement the active feedback impedance.

Sensing the current on the same side of the bias network Lb accurately with a flat frequency response may also be difficult because the ferrites/inductors respond to different frequencies differently. The impedance of the ferrite/inductor may vary, the voltage and current across the ferrite/ inductor may also vary under different frequencies which makes the current detection unreliable. In contrast, in the present implementation, because the cathode side of the load 106 have resistors without ferrites or inductors, sensing the current on the cathode side is reliable.

In some circuits, in order to achieve the high impedance across a wide input band, three or four inductors/ferrites all connected in series may be needed. Each of the inductors/ferrites may be around 2 to 10 microhenries (μH). The circuits in the present disclosure may not need all those inductors/ferrites to provide the high impedance at super low frequencies. In some examples, a single inductor/ferrite may be enough. In addition, the inductance value of the single inductor/ferrite may be only 1/10 or less of one of the inductors/ferrites in the multiple inductor implementation. The reduced height and depth of the single inductor/ferrite may save space in the circuit.

The inductance used on the anode side of the load 106 may be reduced because with the feedback, the current may be monitored on the cathode side of the load 106. The current that flows through the load 106 may be known, accurate and correct.

Figure 2B:
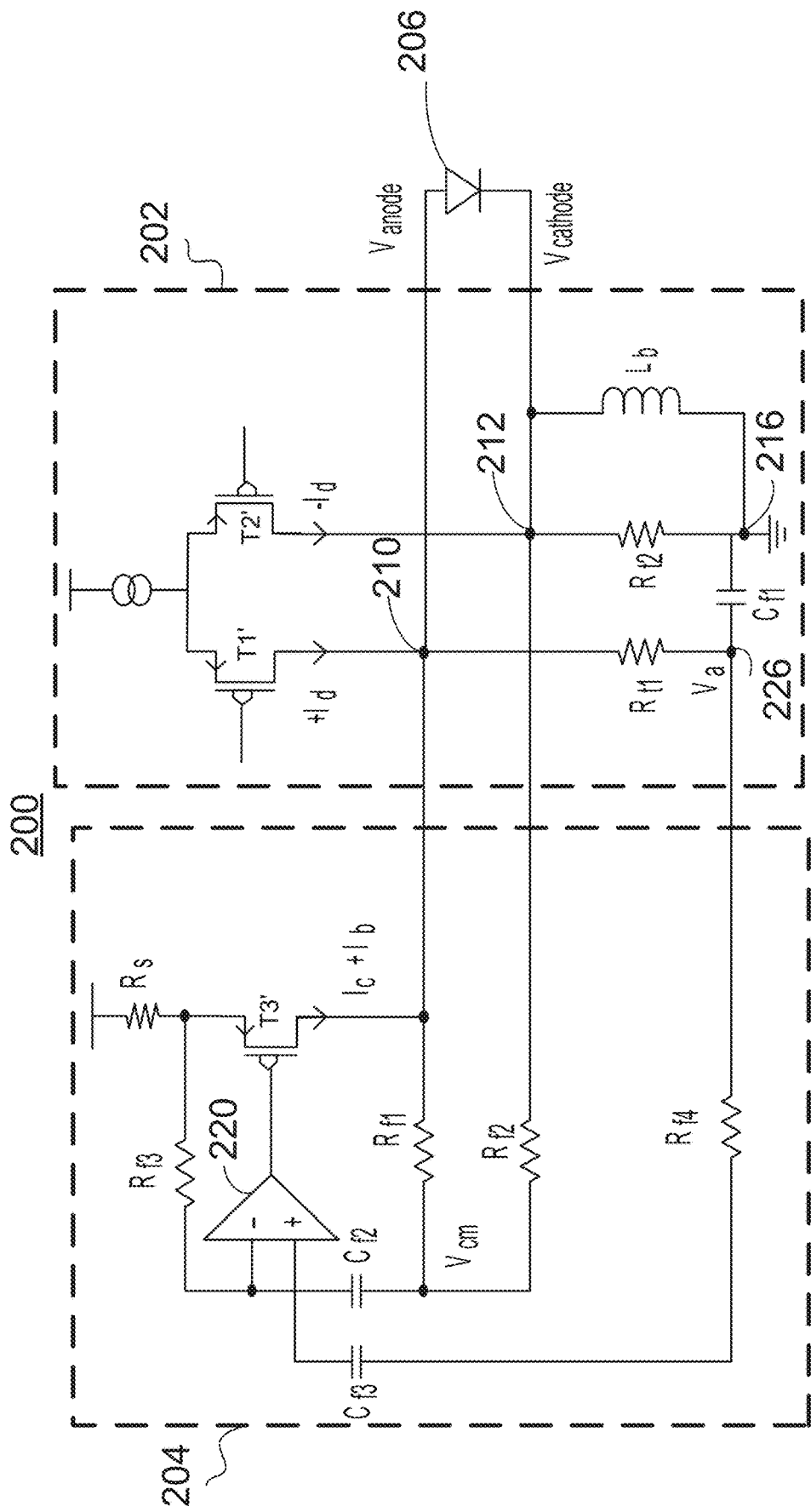
FIG. 2B illustrates a circuit diagram of an example differential signal driver with a feedback loop to maintain an accurate impedance matching using P-type metal-oxide-semiconductor (PMOS) transistors.

FIG. 2A illustrates a circuit diagram of an example differential signal driver with a feedback loop to maintain an accurate impedance matching using positive-negative-positive (PNP) bipolar transistors. FIG. 2B illustrates a circuit diagram of an example differential signal driver with a feedback loop to maintain an accurate impedance matching using P-type metal-oxide-semiconductor (PMOS) transistors.

In FIGS. 2A and 2B, the differential signal driver 200 may include an example driver circuit 202 and an example feedback loop 204. Referring to FIG. 2A, compared with FIG. 1A, the differential signal driver with a feedback loop 200 may also be implemented with PNP bipolar transistors. In FIG. 2A, the bias network Lb including the inductors/ferrites may be connected to the cathode side of the load 206 in the driver circuit 202 while the NPN bipolar transistors T1, T2 and T3 in FIG. 1A are replaced with PNP bipolar transistors. The feedback loop 204 may control the current on the anode side of the load 206. In FIG. 2A, the DC bias voltage Vcc of FIG. 1A is replaced with a ground connection 216.

An equation for the feedback loop 204 to achieve active feedback termination may be shown as:

$$Va - Rt \times Ic = V\text{anode} + V\text{cathode}$$

wherein Va is the anode bias voltage at node 226, Rt is the termination resistor and the resistance of Rt=Rt1=Rt2, Ic is the feedback back correction current generated by the feedback loop 204, Vanode is the voltage at the output node 210 of the driver circuit 202 connected to the anode side of the load 206, and Vcathode is the voltage at the output node 212 of the driver circuit 202 connected to the cathode side of the load 206.

In one or more aspects, the differential signal driver with a feedback loop in the circuit diagram 200 may operate in the same or in a similar manner as the differential signal driver with a feedback loop in the circuit diagram 100, except that the functions of the differential signal driver with a feedback loop 200 are carried out by PNP bipolar transistors instead of NPN bipolar transistors, and the connections on the cathode and anode side of the load are switched. Therefore, the detailed descriptions regarding the differential signal driver with a feedback loop 200 may be omitted for brevity.

Referring to FIG. 2B, compared with FIG. 2A, the differential signal driver with a feedback loop may also be implemented with PMOS transistors T1', T2' and T3' instead of PNP bipolar transistors.

Figure 3A:
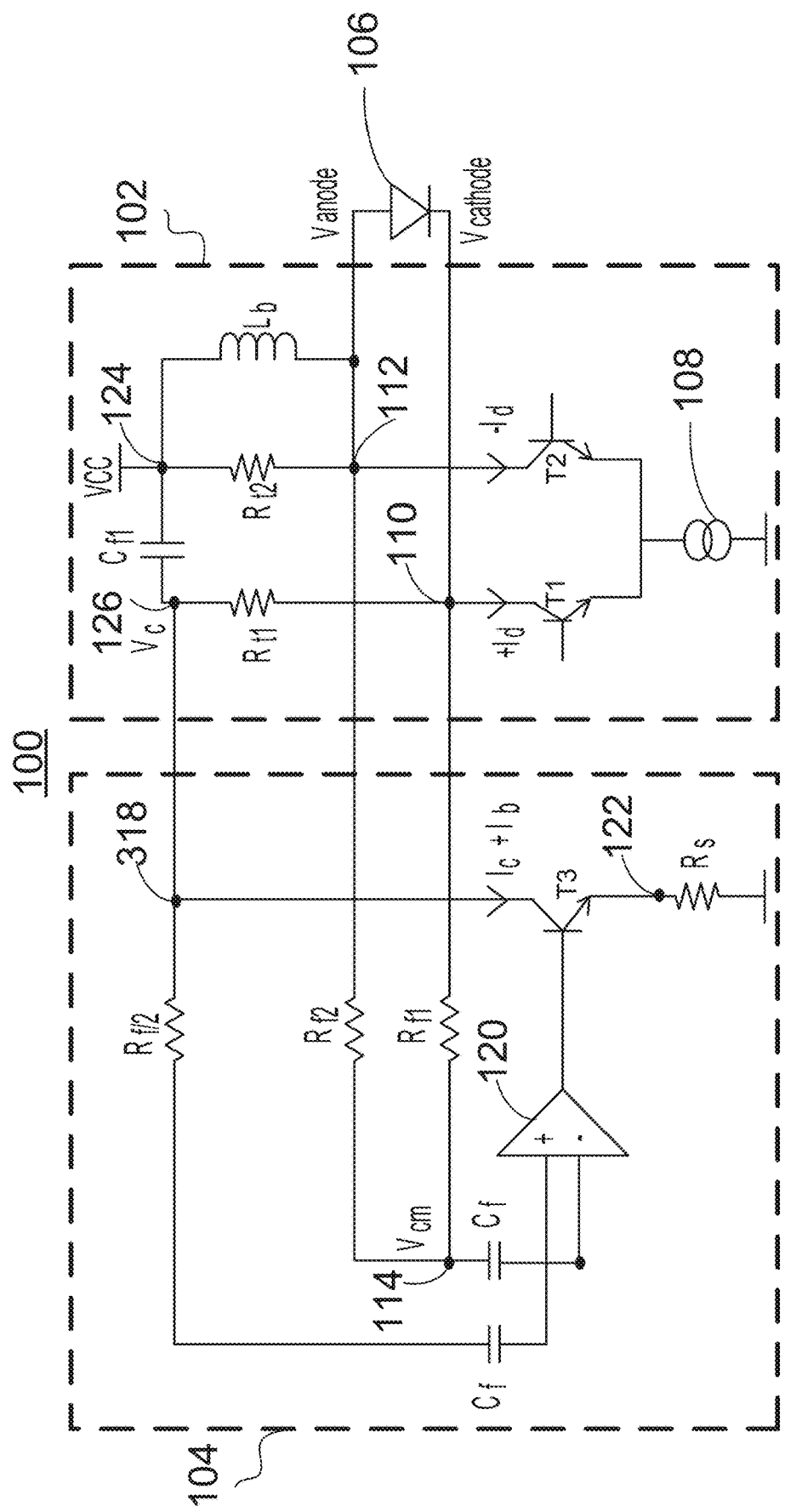
FIG. 3A illustrates a circuit diagram of an example alternative differential signal driver with a feedback loop to maintain an accurate impedance matching.

FIG. 3A illustrates a circuit diagram of an example alternative differential signal driver with a feedback loop to maintain an accurate impedance matching. In contrast to FIG. 1A, the feedback loop 104 in FIG. 3A may supply the feedback correction current Ic at the current injection node 318 which is on the other side of the termination resistor Rt1 (the same as the cathode termination bias node where Vc is supplied). In FIG. 3A, the feedback resistor Rf3 may be omitted because the feedback resistor Rf3 is used to compensate for the Rt×Ic voltage drop across the resistors Rt1 in FIG. 1A. As described in FIGS. 1A, and 1B, transistors T1, T2, and T3 in FIG. 3A may be NPN bipolar transistors or NMOS transistors (not shown in FIG. 3A) when the bias network Lb is connected to the anode side of the load.

Figure 3B:
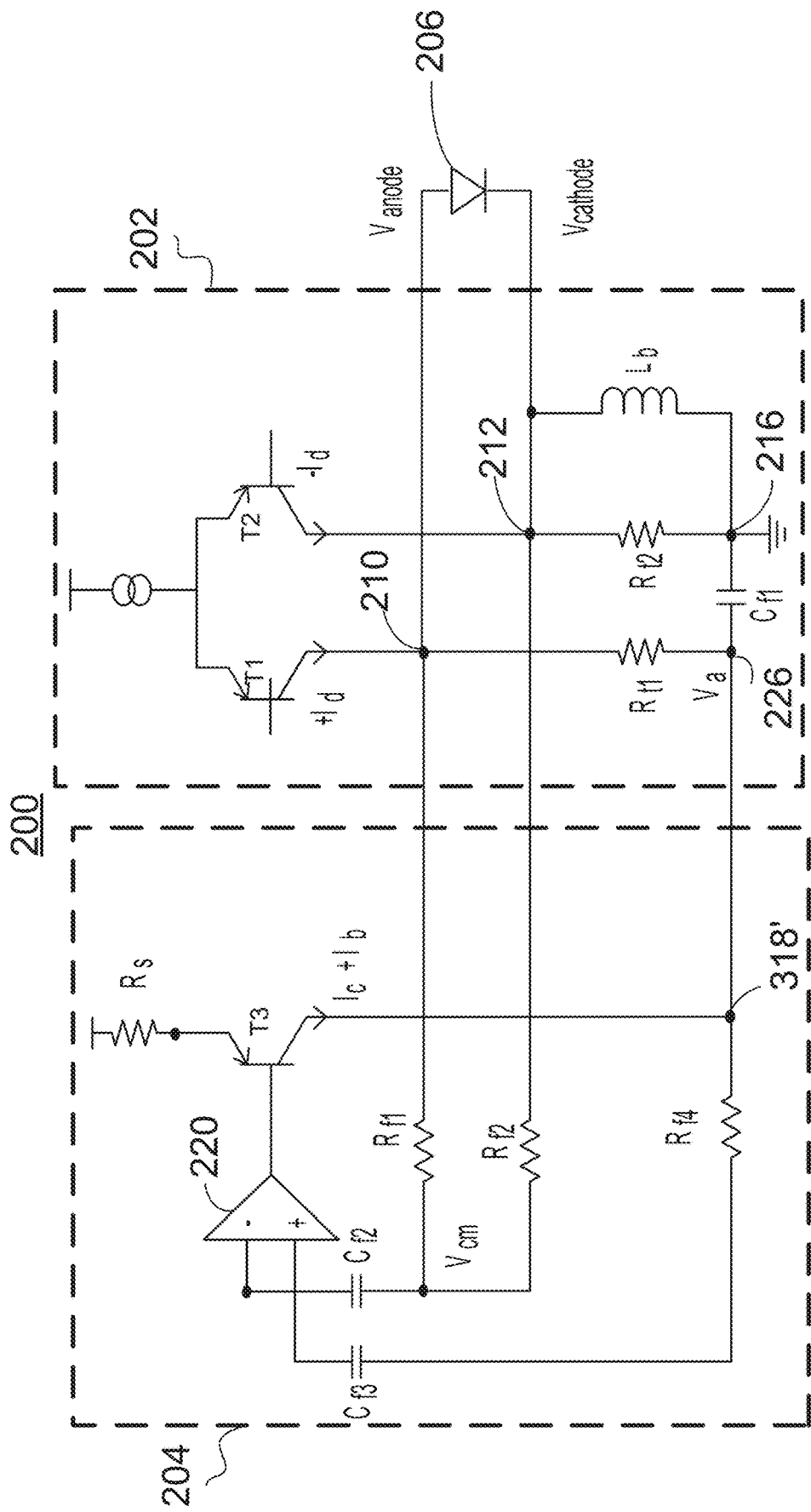
FIG. 3B illustrates a circuit diagram of an example alternative differential signal driver with a feedback loop to maintain an accurate impedance matching.

FIG. 3B illustrates a circuit diagram of an example alternative differential signal driver with a feedback loop to maintain an accurate impedance matching. In contrast to FIG. 2A, the feedback loop 104 in FIG. 3B may supply the feedback correction current Ic at the current injection node 318' which is on the other side of the termination resistor Rt1 (the same as the anode termination). The feedback resistor Rf3 may not be needed as shown in FIG. 3A because the feedback resistor Rf3 is used to compensate for the Rt×Ic voltage change across the resistors Rt1 in FIG. 2A. As described in FIGS. 2A, and 2B, transistors T1, T2, and T3 in FIG. 3B may be PNP bipolar transistors or PMOS transistors (not shown in FIG. 3B) when the bias network Lb is connected to the cathode side of the load.

Figure 4:
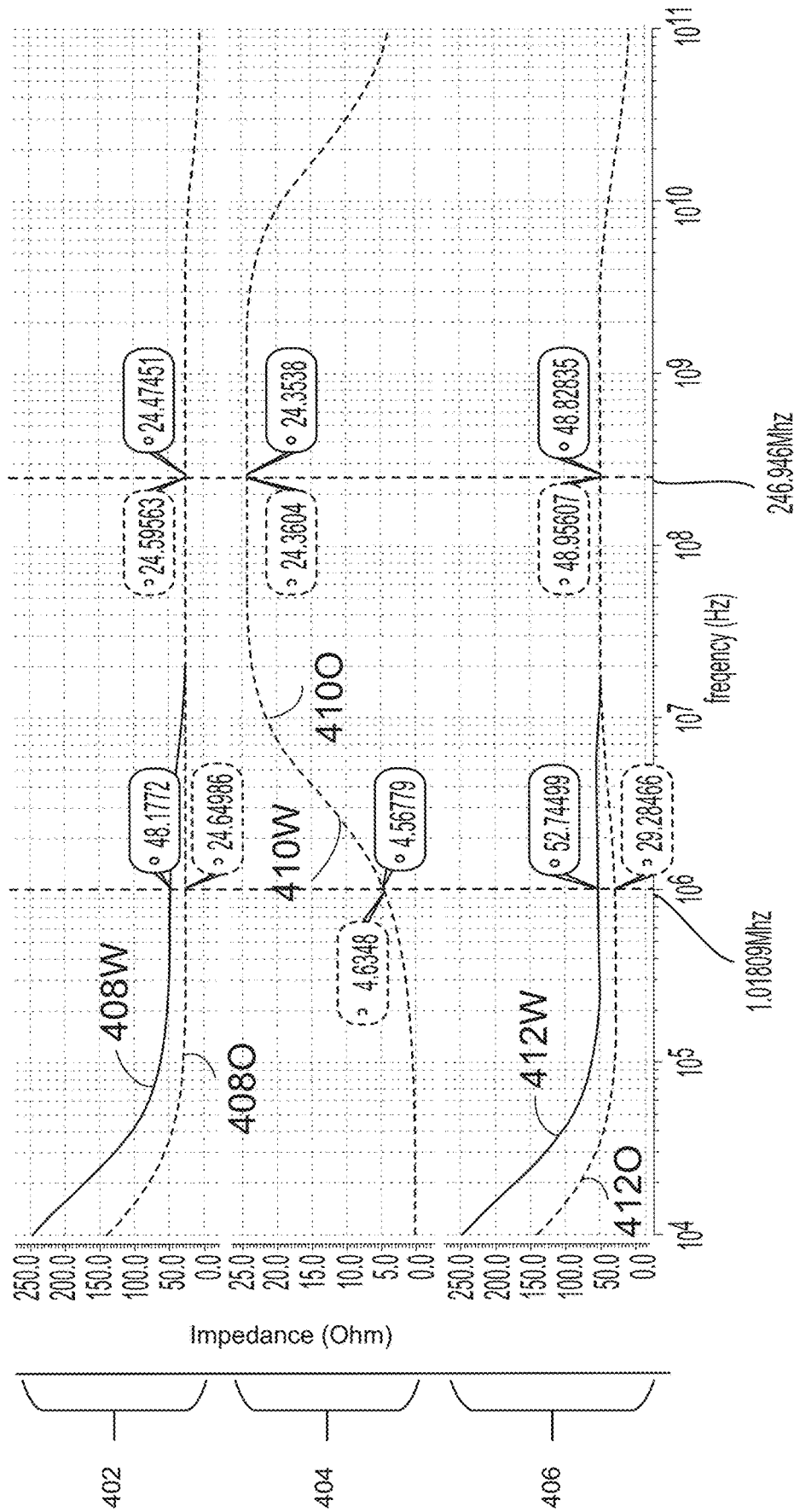
FIG. 4 illustrates a diagram of an example frequency response comparison between a differential signal driver with a feedback loop and a differential signal driver without a feedback loop.

FIG. 4 illustrates a diagram of an example frequency response comparison between a differential signal driver with a feedback loop (e.g., 100 or 200) and a differential signal driver without a feedback loop.

Referring to FIG. 4, three frequency response charts 402, 404 and 406 are shown respectively side by side. The data are generated based on a circuit diagram of FIG. 1A when the termination resistors Rt1=Rt2=25 Ohms. The horizontal scale is the data frequency in Hz, and the vertical scale is the output impedance in Ohms. The output impedance response data lines for the high speed differential signal driver with the feedback loop 104 are represented as solid lines, and the output impedance response data lines for the high speed differential signal driver without the feedback loop 104 are represented as dotted lines. When the output impedance response data line for the high speed differential signal driver with the feedback loop 104 and the output impedance response data line for the high speed differential signal driver without the feedback loop 104 are substantially the same, they are both represented as dotted lines.

In chart 402, data line 408W represents the output impedance response on the cathode side of the load 106 (at output node 110) for the high speed differential signal driver with the feedback loop 104, and data line 408O represents the output impedance response on the cathode side of the load 106 (at output node 110) for the high speed differential signal driver without the feedback loop 104. From chart 402, at a low frequency, for example, 1.01809 MHz frequency, the output impedance on the cathode side of the load 106 for the high speed differential signal driver with the feedback loop 104 may be close to 2Rt, for example 48.2 Ohms. At a low frequency, for example, 1.01809 MHz frequency, the output impedance on the cathode side of the load 106 for the high speed differential signal driver without the feedback loop 104 may be close to Rt, for example 24.6 Ohms. At a high frequency, for example, 246.946 MHz frequency, the output impedance on the cathode side of the load 106 for the high speed differential signal driver with the feedback loop 104 may be close to Rt, for example 24.5 Ohms. At a high frequency, for example, 246.946 MHz frequency, the output impedance on the cathode side of the load 106 for the high speed differential signal driver without the feedback loop 104 may be close to Rt, for example 24.6 Ohms.

In chart 404, data line 410W represents the output impedance response on the anode side of the load 106 (at output node 112) for the high speed differential signal driver with the feedback loop 104, and data line 410O represents the output impedance response on the anode side of the load 106 (at output node 112) for the high speed differential signal driver without the feedback loop 104. From chart 404, at a low frequency, for example, 1.01809 MHz frequency, the output impedance on the anode side of the load 106 for the high speed differential signal driver with the feedback loop 104 may be at a low value close to zero, for example 4.56 Ohms. At a low frequency, for example, 1.01809 MHz frequency, the output impedance on the anode side of the load 106 for the high speed differential signal driver without the feedback loop 104 may be at a low value close to zero, for example 4.63 Ohms. At a high frequency, for example, 246.946 MHz frequency, the output impedance on the anode side of the load 106 for the high speed differential signal driver with the feedback loop 104 may be close to Rt, for example 24.35 Ohms. At a high frequency, for example, 246.946 MHz frequency, the output impedance on the anode side of the load 106 for the high speed differential signal driver without the feedback loop 104 may be close to Rt, for example 24.36 Ohms. Because the current injection mode to adjust the output impedance in on the anode side in FIG. 1A, the data lines 410W with the feedback loop and 410O without the feedback loop are substantially the same.

In chart 406, data line 412W represents the differential output impedance response between the anode side of the load 106 (at output node 112) and the cathode side of the load 106 (at output node 110) for the high speed differential signal driver with the feedback loop 104, and data line 412O represents the differential output impedance response between the anode side of the load 106 (at output node 112) and the cathode side of the load 106 (at output node 110) for the high speed differential signal driver without the feedback loop 104. From chart 406, at a low frequency, for example, 1.01809 MHz frequency, the differential output impedance between the anode side of the load 106 and the cathode side of the load 106 for the high speed differential signal driver with the feedback loop 104 may be close to 2Rt, for example 52.7 Ohms. At a low frequency, for example, 1.01809 MHz frequency, the differential output impedance between the anode side of the load 106 and the cathode side of the load 106 for the high speed differential signal driver without the feedback loop 104 may be close to Rt, for example 29.3 Ohms. At a high frequency, for example, 246.946 MHz frequency, the differential output impedance between the anode side of the load 106 and the cathode side of the load 106 for the high speed differential signal driver with the feedback loop 104 may be close to 2Rt, for example 48.8 Ohms. At a high frequency, for example, 246.946 MHz frequency, the differential output impedance between the anode side of the load 106 and the cathode side of the load 106 for the high speed differential signal driver without the feedback loop 104 may be close to 2Rt, for example 49.00 Ohms. Therefore, the differential output impedance response between the anode side of the load 106 and the cathode side of the load 106 for the high speed differential signal driver with the feedback loop 104 remains flat at about 2Rt from a low frequency to a high frequency range, while the differential impedance drops from about 2Rt to about Rt at a low frequency range. The data line 412O without the feedback loop may be dependent on the response of the inductor/ferrite in the bias network Lb while the data line 412W with the feedback loop may be independent of the characteristics of the inductor/ferrite in the bias network Lb.

As shown in FIG. 4, in some examples, the frequency range of flat response may be from 100 Kilohertz (KHz) to 25 Gigahertz (GHz). A typical ferrite or inductor within the bias network Lb may provide a low impedance at DC or low frequency and a high impedance at the rest of the frequencies. For the typical ferrite or inductor within the bias network Lb, a consistent impedance response may be not possible to obtain without the feedback loop 104 at both the high end of the frequency, for example at 25 GHz, and at the low end of the frequency, for example at 5 Megahertz (MHz) and as a result the flat frequency response range may be very small compared with the 25 GHz range. The present disclosure may provide a good/flat impedance response over the wide frequency range which greatly improves the reliable operating frequency range. In some examples, the feedback loop 104 may be good for low frequency impedance response correction, such as below 10 MHz as shown in FIG. 4. In some examples, depending on the frequency range, the feedback loop 104 may be turned off at high frequency range and be turned on in the low frequency range, for example, 100 KHz to 10 MHz, to provide impedance feedback correction to the load 106 only at a low frequency range. Data provided in the 25 GHz frequency range may be mixed with data at low frequency range, and the feedback loop 104 may make sure the low frequency content information in the data is well preserved and not distorted.

The differential driver with a feedback loop (e.g., 100 or 200) in the present disclosure may save more power than other systems. For example, it may save about 33% more power. For example, in order to achieve the same performance improvement with the flat frequency response discussed above, more inductors may be needed which not only increase power consumptions but also occupy more spaces and cost more. In another example, a higher power supply may be needed to adjust the output impedance of the driver.

The signal driver with the feedback loop in the present disclosure may modulate a single-ended cathode or anode current to maintain the differential output impedance. Compared with a driver without any impedance modulation, only a minimal power increase to extend the differential output impedance lower in frequency may be needed. The feedback loop 104 in FIG. 1A may provide another current source to the cathode termination of the driver circuit 102 to modulate the bias current through the load 106. Since the load 106 may already have an existing bias current flowing through it, the extra modulation may not cost any significant power consumption. For example, in some situations the modulated current may be higher or lower than the existing bias current which may result in substantially the same power consumption as if the feedback loop 104 is not connected to the driver circuit 102. Therefore, with no power increase or minimal power increase, the signal driver with the feedback loop in the present disclosure may achieve significant improvement in performance in the differential output impedance.

Various example embodiments and aspects of the disclosure are described below for convenience. These are provided as examples, and do not limit the subject technology.

Some of the examples described below are illustrated with respect to the figures disclosed herein simply for illustration purposes without limiting the scope of the subject technology.

One or more implementations provide a differential signal driver (e.g., 100 or 200 of FIGS. 1A-3B), including a driver circuit (e.g., 102 or 202) and a feedback loop (e.g., 104 or 204). The driver circuit includes: a first output node (e.g., 110) coupled to a first termination node (e.g., 126) for receiving a first termination bias voltage; a second output node (e.g., 112) coupled to a second termination node (e.g., 124) for receiving a second termination bias voltage; and a bias network (e.g., Lb) connected to the second output node and to the second termination node. The feedback loop includes: a first feedback resistor (e.g., Rf1) connected to the first output node at a first end of the first feedback resistor; a second feedback resistor (e.g., Rf2) connected to the second output node at a first end of the second feedback resistor; and a feedback amplifier (e.g., 120 or 220) configured to provide a feedback correction current (e.g., Ic) as an amplifier output signal to the first output node, wherein the feedback amplifier is coupled to a common node (e.g., Vcm) for receiving a common mode voltage as an amplifier input signal, and wherein the common node is connected to a second end of the first feedback resistor and a second end of the second feedback resistor.

In one or more examples, the feedback amplifier is configured to provide the amplifier output signal to a base terminal of a feedback transistor (e.g., T3), wherein a first terminal of the feedback transistor is connected to the first output node, and a second terminal of the feedback transistor is connected to a sense resistor (e.g., Rs).

In one or more examples, a current provided at the first output node toward the feedback transistor includes the feedback correction current and a bias current flowing through the bias network.

In one or more examples, the common node is connected to a first end of a first feedback capacitor, wherein a second end of the first feedback capacitor (e.g., Cf2) is connected to a first amplifier input node of the feedback amplifier.

In one or more examples, the first output node is connected to a first end of a first termination resistor, wherein a second end of the first termination resistor (e.g., Rt1) is connected to the first termination node.

In one or more examples, the first termination node is connected to a first end of a third feedback resistor, wherein a second end of the third feedback resistor (e.g., Rf4) is connected to a second amplifier input node of the feedback amplifier through a second feedback capacitor (e.g., Cf3).

In one or more examples, a resistance of the third feedback resistor is substantially half of a resistance of the first feedback resistor, and the resistance of the first feedback resistor and a resistance of the second feedback resistor are substantially the same.

In one or more examples, the second output node is connected to a first end of a second termination resistor (e.g., Rt2), wherein a second end of the second termination resistor is connected to the second termination node, and a resistance of the second termination resistor is the same as a resistance of the first termination resistor.

In one or more examples, the bias network includes a ferrite, wherein a first end of the ferrite is connected to the second termination node, and a second end of the ferrite is connected to the second output node.

In one or more examples, the feedback amplifier is configured to provide the feedback correction current to modulate an output impedance between the first output node and the second output node to maintain the output impedance at a substantially consistent level over a frequency range.

In one or more examples, the first termination bias voltage is configured to be controlled by the feedback correction current and a sum of a first output voltage at the first output node and a second output voltage at the second output node.

In one or more examples, the first output node is configured to receive a first current (e.g., +Id) through the first termination transistor and provide the first current to a current sink, and the second output node is configured to receive a second current (e.g., −Id) through the second termination transistor and provide the second current to the current sink.

In one or more examples, the first output node is configured to be connected to a cathode side of a load, the second output node is configured to be connected to an anode side of the load, and the first termination transistor and the second termination transistor are negative-positive-negative (NPN) bipolar transistors or N-type metal-oxide-semiconductor (NMOS) transistors.

In one or more examples, the first output node is configured to be connected to an anode side of a load, the second output node is configured to be connected to a cathode side of the load, and the first termination transistor and the second termination transistor are positive-negative-positive (PNP) bipolar transistors or P-type metal-oxide-semiconductor (PMOS) transistors.

One or more implementations provide a differential signal driver (e.g., 100 or 200 of FIGS. 1A-3B), including a driver circuit and a feedback loop. The driver circuit includes: a first output node coupled to a first termination node for receiving a first termination bias voltage through a first termination resistor; a second output node coupled to a second termination node for receiving a second termination bias voltage through a second termination resistor; and a bias network connected to the second output node and to the second termination node. The feedback loop includes: a first feedback resistor connected to the first output node at a first end of the first feedback resistor; a second feedback resistor connected to the second output node at a first end of the second feedback resistor; and a feedback amplifier configured to provide a feedback correction current as an amplifier output signal to the first termination node, wherein the feedback amplifier is coupled to a common node for receiving a common mode voltage as an amplifier input signal, and wherein the common node is connected to a second end of the first feedback resistor and a second end of the second feedback resistor.

In one or more examples, the common node is connected to a first end of a first feedback capacitor, wherein a second end of the first feedback capacitor is connected to a first amplifier input node of the feedback amplifier.

In one or more examples, the first termination node is connected to a first end of a third feedback resistor, wherein a second end of the third feedback resistor is connected to a second amplifier input node of the feedback amplifier through a second feedback capacitor.

In one or more examples, the feedback amplifier is configured to provide the feedback correction current to modulate an output impedance between the first output node and the second output node to maintain the output impedance at a substantially consistent level over a frequency range from 1 MHz to 20 GHz.

In one or more examples, the first termination bias voltage is configured to be controlled by the feedback correction current and a sum of a first output voltage at the first output node and a second output voltage at the second output node.

One or more implementations provide a method for providing a differential signal driver. The method includes providing a driver circuit and providing a feedback loop. The step of providing a driver circuit includes: coupling a first output node to a first termination node for receiving a first termination bias voltage through a first termination resistor; coupling a second output node to a second termination node for receiving a second termination bias voltage through a second termination resistor; and connecting a bias network to the second output node and to the second termination node. The step of providing a feedback loop includes: connecting a first feedback resistor of the feedback loop to the first output node at a first end of the first feedback resistor; connecting a second feedback resistor of the feedback loop to the second output node at a first end of the second feedback resistor; and configuring a feedback amplifier of the feedback loop to provide a feedback correction current as an amplifier output signal to the first termination node, wherein the feedback amplifier is coupled to a common node for receiving a common mode voltage as an amplifier input signal, and wherein the common node is connected to a second end of the first feedback resistor and a second end of the second feedback resistor.

In one or more aspects, a method includes one or more methods, operations or portions thereof described herein. In one or more aspects, an apparatus includes one or more memories and one or more processors, the one or more processors configured to cause performing one or more methods, operations or portions thereof described herein. In one or more aspects, an apparatus includes means adapted for performing one or more methods, operations or portions thereof described herein. In one or more aspects, a hardware apparatus includes circuits configured to perform one or more methods, operations or portions thereof described herein. In one or more aspects, an apparatus includes components operable to carry out one or more methods, operations or portions thereof described herein. In one or more aspects, anon-transitory machine-readable storage medium (e.g., one or more memories and/or one or more registers) store instructions that, when executed by one or more processors, cause one or more processors to perform one or more methods, operations or portions thereof described herein.

Further examples of the subject technology include various subsets of the above examples combined or otherwise re-arranged in various forms.

In some examples, to illustrate the interchangeability of hardware and software, items such as the various illustrative blocks, modules, components, methods, operations, instructions, and algorithms may have been described generally in terms of their functionality. In some examples, whether such functionality is implemented as hardware, software or a combination of hardware and software depends upon the particular application and design constraints imposed on the overall system. Skilled artisans may implement the described functionality in varying ways for each particular application.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" may refer to only A, only B, or only C; any combination of A, B, and C; and/or at least one of each of A, B, and C.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In one aspect, the blocks or components described in this present disclosure may be implemented in circuits or integrated circuits. A circuit or an integrated circuit may include one or more transistors.

In one or more aspects, a transistor may include one or more bipolar junction transistors (BJTs), which may refer to any of a variety of multi-terminal transistors operating on the principal of carrying current using both electrons and holes, including, but not limited to, an n-p-n BJT (NPN BJT) and a p-n-p BJT (PNP BJT).

In one or more aspects, transistors may include one or more field effect transistors (FETs), which may refer to any of a variety of multi-terminal transistors operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET). A MOSFET may be an n-type MOSFET (NMOS) or a p-type MOSFET (PMOS). A complementary metal-oxide semiconductor (CMOS) device may include an NMOS and a PMOS.

In one or more aspects, transistors may include one or more BJTs and FETs. In one or more examples, transistors may include one or more BJTs and one or more CMOS devices, which may be referred to as Bi-CMOS devices.

Unless otherwise mentioned, various configurations described in the present disclosure may be implemented on a silicon, silicon-germanium (SiGe), gallium arsenide (GaAs), indium phosphide (InP) or indium gallium phosphide (InGaP) substrate, or any other suitable substrate.

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa. In some aspects, a source and a drain may be used interchangeably.

The transistors implemented herein are not limited thereto. In one or more examples, the transistors may include other types such as FETs and/or some combination of BJTs and FETs. Furthermore, in one or more examples, the transistors may include various types such as NPN BJTs, PNP BJTs, some types of FETs (e.g., NMOS or PMOS) and/or some combination thereof.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

In one or more examples, when an element is "connected" or "coupled" to another element, the element can be directly connected or coupled to another element, and can be indirectly connected or coupled to another element with one or more intervening elements disposed or interposed between the elements, unless otherwise specified.

The disclosure is provided to enable any person skilled in the art to practice the various aspects described herein. In some instances, when a detailed description of well-known functions or configurations may unnecessarily obscure aspects of the present disclosure, the detailed description thereof may have been omitted. The disclosure provides various examples of the subject technology, and the subject technology is not limited to these examples. Various modifications to these aspects will be readily apparent to those skilled in the art, and the principles described herein may be applied to other aspects.

Unless stated otherwise, like reference numerals refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

When the term "comprise," "have," "include," "contain," "constitute," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. An element proceeded by "a," "an," "the," or "said" does not, without further constraints, preclude the existence of additional elements.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, or the like). Furthermore, while the subject disclosure may provide many example ranges and values, these are non-limiting examples, and other ranges and values are within the scope of the subject technology.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A differential signal driver, comprising:
    a driver circuit, including:
        a first output node coupled to a first termination node for receiving a first termination bias voltage;
        a second output node coupled to a second termination node for receiving a second termination bias voltage;
        a first termination impedance element connected across the first output node and the first termination node;
        a second termination impedance element connected across the second output node and the second termination node; and
        a bias network connected to the second output node and to the second termination node; and
    a feedback loop, including:
        a first feedback resistor connected to the first output node at a first end of the first feedback resistor;
        a second feedback resistor connected to the second output node at a first end of the second feedback resistor; and
        a feedback amplifier configured to provide a feedback correction current as an amplifier output signal to the first output node,
    wherein:
    the feedback amplifier is coupled to a common node for receiving a common mode voltage as an amplifier input signal;
    the common node is connected to a second end of the first feedback resistor and a second end of the second feedback resistor;
    the second termination node is different from the first termination node;
    the second termination bias voltage is different from the first termination bias voltage;
    the bias network is separate and different from each and both of the first termination impedance element and the second termination impedance element;
    the bias network is connected in parallel to the second termination impedance element across the second output node and the second termination node but is not connected in parallel to the first termination impedance element across the first output node and the first termination node; and
    the feedback amplifier is configured to provide the feedback correction current as the amplifier output signal to the first output node but not to the second output node.

2. The differential signal driver according to claim 1, wherein the feedback amplifier is configured to provide the amplifier output signal to a base terminal of a feedback transistor, wherein a first terminal of the feedback transistor is connected to the first output node, and a second terminal of the feedback transistor is connected to a sense resistor.

3. The differential signal driver according to claim 2, wherein a current provided at the first output node toward the feedback transistor includes the feedback correction current and a bias current flowing through the bias network.

4. The differential signal driver according to claim 1, wherein the common node is connected to a first end of a first feedback capacitor, wherein a second end of the first feedback capacitor is connected to a first amplifier input node of the feedback amplifier.

5. The differential signal driver according to claim 1, wherein:
    the first termination impedance element comprises a first termination resistor; and
    the first output node is connected to a first end of the first termination resistor, wherein a second end of the first termination resistor is connected to the first termination node.

6. The differential signal driver according to claim 5, wherein the first termination node is connected to a first end of a third feedback resistor, wherein a second end of the third feedback resistor is connected to a second amplifier input node of the feedback amplifier through a second feedback capacitor.

7. The differential signal driver according to claim 6, wherein a resistance of the third feedback resistor is substantially half of a resistance of the first feedback resistor, and the resistance of the first feedback resistor and a resistance of the second feedback resistor are substantially the same.

8. The differential signal driver according to claim 5, wherein:
    the second termination impedance element comprises a second termination resistor; and
    the second output node is connected to a first end of the second termination resistor, wherein a second end of the second termination resistor is connected to the second termination node, and a resistance of the second termination resistor is the same as a resistance of the first termination resistor.

9. The differential signal driver according to claim 1, wherein the bias network includes a ferrite, wherein a first end of the ferrite is connected to the second termination node, and a second end of the ferrite is connected to the second output node.

10. The differential signal driver according to claim 1, wherein the feedback amplifier is configured to provide the feedback correction current to modulate an output impedance between the first output node and the second output node to maintain the output impedance at a substantially consistent level over a frequency range.

11. The differential signal driver according to claim 1, wherein the first termination bias voltage is configured to be controlled by the feedback correction current and a sum of a first output voltage at the first output node and a second output voltage at the second output node.

12. The differential signal driver according to claim 8, wherein the first output node is configured to receive a first current through a first termination transistor and provide the first current to a current sink, and the second output node is configured to receive a second current through a second termination transistor and provide the second current to the current sink.

13. The differential signal driver according to claim 8, wherein:
the first output node is configured to be connected to a cathode side of a load;
the second output node is configured to be connected to an anode side of the load; and
a first termination transistor and a second termination transistor, coupled to the first output node and the second output node, respectively, are negative-positive-negative (NPN) bipolar transistors or N-type metal-oxide-semiconductor (NMOS) transistors.

14. The differential signal driver according to claim 8, wherein:
the first output node is configured to be connected to an anode side of a load;
the second output node is configured to be connected to a cathode side of the load; and
a first termination transistor and a second termination transistor, coupled to the first output node and the second output node, respectively, are positive-negative-positive (PNP) bipolar transistors or P-type metal-oxide-semiconductor (PMOS) transistors.

15. A differential signal driver, comprising:
a driver circuit, including:
a first output node coupled to a first termination node for receiving a first termination bias voltage through a first termination resistor;
a second output node coupled to a second termination node for receiving a second termination bias voltage through a second termination resistor; and
a bias network connected to the second output node and to the second termination node; and
a feedback loop, including:
a first feedback resistor connected to the first output node at a first end of the first feedback resistor;
a second feedback resistor connected to the second output node at a first end of the second feedback resistor; and
a feedback amplifier configured to provide a feedback correction current as an amplifier output signal to the first termination node,
wherein:
the feedback amplifier is coupled to a common node for receiving a common mode voltage as an amplifier input signal;
the common node is connected to a second end of the first feedback resistor and a second end of the second feedback resistor;
the second termination node is different from the first termination node;
the second termination bias voltage is different from the first termination bias voltage;

the bias network is separate and different from each and both of the first termination resistor and the second termination resistor;
the bias network is connected in parallel to the second termination resistor across the second output node and the second termination node but is not connected in parallel to the first termination resistor across the first output node and the first termination node; and
the feedback amplifier is configured to provide the feedback correction current as the amplifier output signal to the first termination node but not to the second termination node.

16. The differential signal driver according to claim 15, wherein the common node is connected to a first end of a first feedback capacitor, wherein a second end of the first feedback capacitor is connected to a first amplifier input node of the feedback amplifier.

17. The differential signal driver according to claim 16, wherein the first termination node is connected to a first end of a third feedback resistor, wherein a second end of the third feedback resistor is connected to a second amplifier input node of the feedback amplifier through a second feedback capacitor.

18. The differential signal driver according to claim 15, wherein the feedback amplifier is configured to provide the feedback correction current to modulate an output impedance between the first output node and the second output node to maintain the output impedance at a substantially consistent level over a frequency range from 1 MHz to 20 GHz.

19. The differential signal driver according to claim 15, wherein the first termination bias voltage is configured to be controlled by the feedback correction current and a sum of a first output voltage at the first output node and a second output voltage at the second output node.

20. A method for providing a differential signal driver, the method comprising:
providing a driver circuit, including:
coupling a first output node to a first termination node for receiving a first termination bias voltage through a first termination resistor;
coupling a second output node to a second termination node for receiving a second termination bias voltage through a second termination resistor; and
connecting a bias network to the second output node and to the second termination node; and
providing a feedback loop, including:
connecting a first feedback resistor of the feedback loop to the first output node at a first end of the first feedback resistor;
connecting a second feedback resistor of the feedback loop to the second output node at a first end of the second feedback resistor; and
configuring a feedback amplifier of the feedback loop to provide a feedback correction current as an amplifier output signal to the first termination node,
wherein:
the feedback amplifier is coupled to a common node for receiving a common mode voltage as an amplifier input signal;
the common node is connected to a second end of the first feedback resistor and a second end of the second feedback resistor;
the second termination node is different from the first termination node;
the second termination bias voltage is different from the first termination bias voltage;

the bias network is separate and different from each and both of the first termination resistor and the second termination resistor;

the bias network is connected in parallel to the second termination resistor across the second output node and the second termination node but is not connected in parallel to the first termination resistor across the first output node and the first termination node; and the feedback amplifier is configured to provide the feedback correction current as the amplifier output signal to the first termination node but not to the second termination node.

* * * * *